US007741562B2

(12) United States Patent
Crotinger et al.

(10) Patent No.: US 7,741,562 B2

(45) Date of Patent: Jun. 22, 2010

(54) WALL PLATE ASSEMBLY WITH INTEGRAL UNIVERSAL SERIAL BUS MODULE

(75) Inventors: Jennifer Dawn Crotinger, Covington, OH (US); Timothy Kerby, Huber Heights, OH (US); Gary Michael Hess, Springfield, OH (US)

(73) Assignee: Lastar Inc., Dayton, OH (US)

( * ) Notice: Subject to any disclaimer, the term of this patent is extended or adjusted under 35 U.S.C. 154(b) by 128 days.

(21) Appl. No.: 11/967,335

(22) Filed: Dec. 31, 2007

(65) Prior Publication Data

US 2008/0318474 A1 Dec. 25, 2008

Related U.S. Application Data

(60) Provisional application No. 60/944,916, filed on Jun. 19, 2007.

(51) Int. Cl.
*H05K 5/03* (2006.01)

(52) U.S. Cl. ........................................ 174/66; 439/535

(58) Field of Classification Search .................. 174/66, 174/53-58; 439/535-536; 709/250
See application file for complete search history.

(56) References Cited

U.S. PATENT DOCUMENTS

| | | | | |
|---|---|---|---|---|
| 6,420,964 | B1 | 7/2002 | Nishikawa et al. | |
| 6,880,020 | B1 | 4/2005 | Rubinstein et al. | |
| 6,943,296 | B2 | 9/2005 | Perrella et al. | |
| 7,331,819 | B2 * | 2/2008 | Nelson et al. | 439/577 |
| 2001/0056513 | A1 | 12/2001 | Ueda | |
| 2005/0020144 | A1 | 1/2005 | Lunecki et al. | |
| 2005/0176274 | A1 | 8/2005 | Hoops et al. | |
| 2005/0278472 | A1 * | 12/2005 | Gierke | 710/313 |
| 2007/0037442 | A1 | 2/2007 | Sullivan et al. | |
| 2008/0013957 | A1 * | 1/2008 | Akers et al. | 398/115 |

OTHER PUBLICATIONS

ActiveLinx (TM) USB Plates; Liberty Wire & Cable.

International Search Report and Written Opinion dated Aug. 18, 2008 pertaining to International application No. PCT/US2008/063569.

* cited by examiner

*Primary Examiner*—Michael C Zarroli
(74) *Attorney, Agent, or Firm*—Dinsmore & Shohl LLP

(57) ABSTRACT

A wall plate assembly including a wall plate with an integrated USB module. The assembly includes a USB connector and printed circuit board formed together on the wall plate as an integral whole such that USB extender circuitry is situated directly on, or is formed as part of, the printed circuit board. A quick-connect coupling enables fast electrical connection and disconnection with a complementary quick-connect coupling on a USB wire.

19 Claims, 6 Drawing Sheets

WALL PLATE ASSEMBLY WITH INTEGRAL UNIVERSAL SERIAL BUS MODULE

This application claims the benefit of the filing date of U.S. Provisional Application No. 60/944,916, filed Jun. 19, 2007.

BACKGROUND OF THE INVENTION

The present invention relates generally to wall plates used to convey electric signals through premise wiring systems, and more particularly to a wall plate assembly with an integrated universal serial bus (USB) module for USB extension without the need for an external power supply.

USBs are an increasingly popular way to connect computers to peripheral devices, such as data input/output, portable memory devices and audio/visual equipment. By placing the issues associated with linking dissimilar devices into on-board software (or protocol), the USB makes connection between a hub (or source) and function (or device). USBs can be powered so that they regenerate signals, thereby allowing great lengths between hub and function devices.

Wall plates are commonly used to terminate premise wiring. In one general form, the wiring acts as a signal carrier for electrical signals, while in a specific form is capable of conveying audio, video and related data signals between a signal source (such as a computer, audio, video or combination device) and the wall plate. Audio, video and data devices (such as displays, monitors, digital video disk (DVD) players, compact disk (CD) players, video tape recorders or the like) can be plugged into the outlet of the wall plate to complete the signal path. These, as well as other device that may employ USB electronics, connections and related circuitry, may be placed at distances remote from a host, often at distances far greater than that which a USB signal is able to extend.

In such circumstances, it may be necessary to boost or otherwise extend the USB signal. In one form of signal extension, the USB electronics are coupled to an external power source, such as a conventional AC source in what is referred to as a self-powered configuration. Such coupling allows the needed increase in range, but does so through additional wiring that may be prohibitive from a space, cost and related complexity perspective. In another form, the USB electronics draw all of their needed power from the USB connection itself, in what is known as a bus-powered configuration. Typically, the USB electronics are incorporated into one or more separate modular units that provides the extension in range, and includes a transmitter unit (for example, at the host end) and a receiver unit (for example, at the device end). Each unit is in turn connected to a wall plate so that devices requiring USB connection can do so through the wall plate. While useful for its intended purpose, such designs are problematic in that special attachment schemes between the USB electronics and the wall plate are necessary. For example, dongle and related connectivity cables are required. As with the external-powered approach discussed above, the self-powered approach makes the wall plate assembly bulky and expensive. In either approach, the presence of separately attached, exposed and removable components also renders the wall plates susceptible to damage during transport, installation nor the like.

It is therefore desirable that a more efficient, lower-cost, more reliable approach to connecting USB equipment through a wall plate be developed. It is additionally desirable that a compact, easy-to-use wall plate assembly incorporating self-powered USB features for extended range be developed.

It is further desirable that an approach to packaging USB signal-extending circuitry such that the circuitry is an integral part of a wall plate assembly.

BRIEF SUMMARY OF THE INVENTION

These desires are met by the present invention, where a wall plate assembly and a method of connecting USB-compatible wiring is disclosed. According to a first aspect of the invention, a wall plate assembly includes USB-compatible hardware and related circuitry mounted onto a wall plate such that the wall plate and module define a single unit that is mechanically and electrically integrated. In the present context, disparate components, members, devices or related equipment are considered to define a mechanically integrated or integral whole or unit when such components are combined in such a way as to make them rigidly secured to one another such that they are integral in a functional sense. Means such as fastening and welding may be indicative of such integral structure if, as a result of such fastening, welding or the like, they produce an article that is of substantially unitary or one-piece construction. Generally, the presence of separate, readily removable and attachable components (such as hand-connected dongle cables or related wires, as well as those components situated on an outer surface or periphery of the unit) would be destructive of such an integral construction. Similarly, separate components are considered to be electrically integrated when the connection between them is through predominantly non-separable components. Thus, cables with quick-connect or related non-permanent features are considered to be non-integral, whereas hardwired, adhesively mounted, soldered or trace-connected (such as on a printed circuit board) components are considered to be integral.

The wall plate assembly includes a wall plate defining a face (for example a front face) with one or more USB connectors formed in the face, a wall mounting member, a circuit board and a housing configured to substantially contain the circuit board. The circuit board includes USB extender circuitry and an electrical interface extending from the circuit board and cooperative with the extender circuitry such that upon coupling of the interface to a first USB-compatible component, a signal may be operated upon by the extender circuitry while being transmitted between first and second USB-compatible components, where one is connected directly to the connector and the other directly to the interface. In the present context, the term “substantially” refers to an arrangement of elements or features that, while in theory would be expected to exhibit exact correspondence or behavior, may, in practice embody something less than exact. As such, the term denotes the degree by which a quantitative value, measurement or other related representation may vary from a stated reference without resulting in a change in the basic function of the subject matter at issue. By having the extender circuitry be directly secured both electrically and mechanically to one or more other components within the assembly, such as the connector, mounting member, wall plate, circuit board or housing, it takes on an integrated structure not possible with configurations where the circuitry can be readily attached and detached.

Optionally, the wall mounting member is configured as a bracket that can mount to a wall structure by accepting a fastener through it. The extender circuitry can be formed on the circuit board, or can be mounted directly to the circuit board. In either event, it is desirable to avoid cables with quick-connect and other relatively non-permanent connectivity. In one form, the wall mounting member and the wall plate are formed as a unitary structure, while in another, they can be permanently affixed to one another. In the present context, terms implying "permanent" or "semi-permanent" connectivity between components include situations where that which is joined is not intended on becoming separated such that in the process of such separation, damage is done to either or both of them, or the structural or electrical properties are defeated or at least severely curtailed. The assembly may further include one or more posts extending between the circuit board and the wall plate to create a spaced relationship between them. In another optional form, the wall plate, wall mounting member, circuit board and housing are rigidly affixed to one another. The housing may be formed around the printed circuit board on the back of the wall plate such that it defines a substantially closed, rectangular containment (such as a simple box). Furthermore, the box may be made from an inexpensive, lightweight material (such as plastic), or may be made from a metal-based material so that the housing acts as an electromagnetic shield that can substantially enclose the circuit board. In either material configuration, it also has an aperture formed therein to allow the rear coupling to be easily accessed by a jack or related terminus point of USB wiring being fed to the wall plate assembly. The housing may additionally define a recess in the housing's otherwise substantially rectangular shaped outer dimension. In this way, the aperture discussed above defines a cutout for the coupling. The extender circuitry may be permanently affixed to the circuit board or connector. The assembly may also include one or both of a transmitter and a receiver so that USB signals coming into or leaving the assembly can be appropriately conveyed.

According to another aspect of the invention, a bus-powered USB wiring system is disclosed. The system includes an assembly generally similar to that discussed in the previous aspect, and further includes at least one wire, cable or similar electrically-conductive signal carrier to convey a USB-compatible signal. The wire has a proximal end configured to connect to a USB host and a distal end configured to connect to a USB device. The assembly includes a wall plate defining a face with one or more USB connectors formed in it. The assembly further includes a wall mounting member (for example, a bracket) and a circuit board connected to one or both of the wall plate and the wall mounting member. The circuit board includes USB extender circuitry and an electrical interface, where the latter is mounted to or otherwise extends from the circuit board so that upon coupling of the interface to the wire, a signal that is transmitted between the host and device through the wire may be operated upon by the extender circuitry while passing through the wall plate assembly. The extender circuitry is electrically coupled to one of the connector and the interface such that it receives its operating electrical power from a respective one of the host and device. In addition, the assembly includes a housing that acts as an enclosure or container for the circuit board, extender circuitry and electrical interface. The housing may include cutouts or apertures formed therein to allow connection of the wire to the interface and circuit board.

Optional features include connecting numerous wall plate assemblies together. In addition, one of the wall plate assemblies may further include or be connected to a transmitter, while a second may include or be connected to a receiver. In one form, the transmitter is placed serially upstream of the receiver. For example, if the wiring is used to support a computer system, the transmitter can be located at or with the computer such that one or more wall plate assemblies can include receivers and be linked to the transmitter through appropriate cable or related wiring. The wire used to convey the USB-compatible signal may be an industry-standard variety, such as an RJ CAT 5 cable.

According to another aspect of the invention, a method of connecting USB-based components through a wall plate assembly is disclosed. The method includes arranging the wiring to include a quick-connect coupling that can be connected to a complementary quick-connect coupling situated on a wall plate assembly. The wall plate assembly includes (in addition to the complementary coupling) a USB module mounted to a wall plate such that the module and plate form an integral whole. Optionally, connection between the wall plate assembly to one or more USB wires can be through complementary quick-connect couplings. Such coupling may be permanently attached to the USB module, which is preferably formed on or as part of a printed circuit board.

Optionally, the method further includes securing at least one of the wall plate, wall mounting member and circuit board to a housing; in this way, the housing can substantially contain the circuit board. In another particular form, electric power can be provided to the wall plate assembly from the host. More particularly, the first component can be a computer, including desktop, laptop or other related variants. The second component (which is preferably associated with the device) can be a printer, video display, cellular telephone, digital camera, scanner, bar code reader, modem, personal digital assistant and an integrated services digital network (ISDN) terminal adapter.

BRIEF DESCRIPTION OF THE SEVERAL VIEWS OF THE DRAWINGS

The following detailed description of specific embodiments of the present invention can be best understood when read in conjunction with the following drawings, where like structure is indicated with like reference numerals and in which.

DETAILED DESCRIPTION

Figure 1:
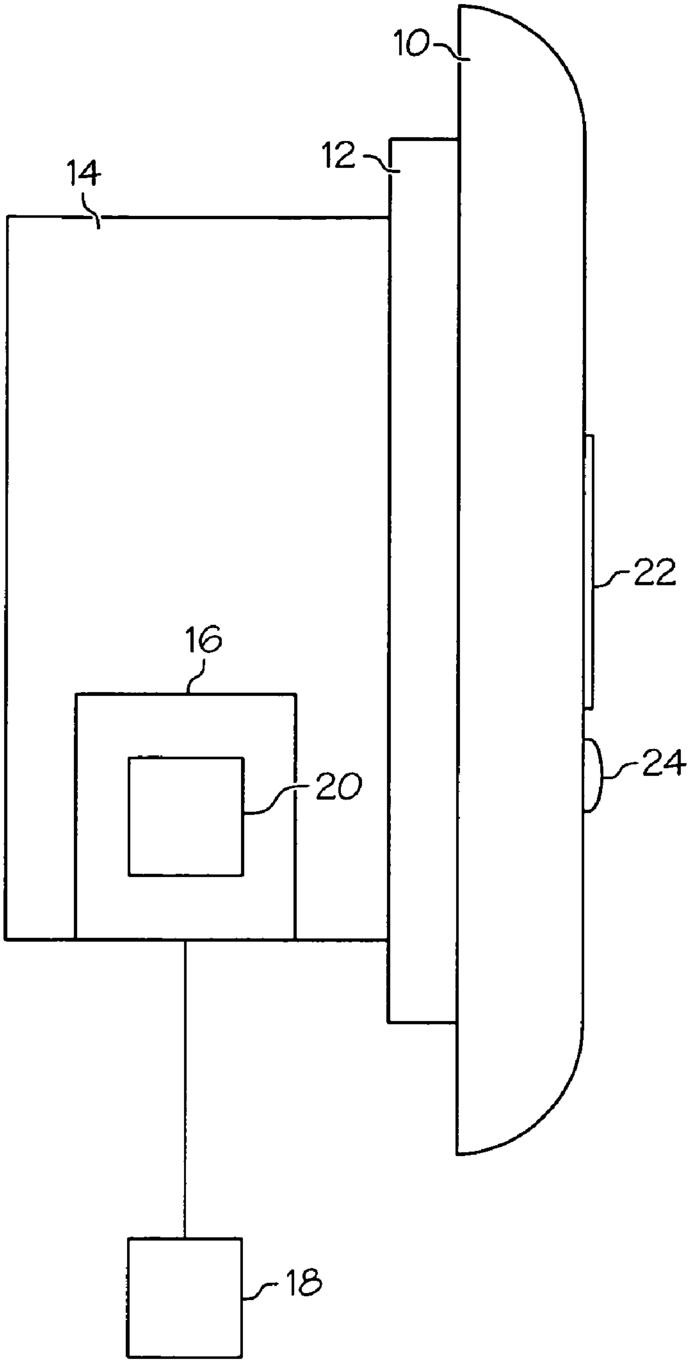
FIG. 1 (PRIOR ART)
FIG. 1 illustrates a schematic view of a wall plate assembly with USB connectivity according to one form of the prior art.

USB-configured wall plates can be used to provide asymmetric connectivity between a USB-compatible host and a USB-compatible remote device, as well as act as a hub for numerous USB ports in versions that include numerous connectors. In this latter configuration, they can function in a manner generally similar to external (i.e., stand-alone) USB hubs. In any event, USB-configured wall plates generally include self-power or bus power, as previously discussed. Referring first to FIG. 1, the assembly of a wall plate 10 according to a self-powered form of the prior art is shown. The wall plate 10 includes a first (forward-facing) surface, second (i.e., rearward-facing) surface, a printed circuit board 12 and USB hub circuit 14 mounted thereto. A USB connector 22 extends from the printed circuit board 12 through the first and second surfaces of the wall plate 10, as does an indicator light 24. The USB hub circuit 14 is structured to permit numerous USB devices to be connected together and to a host computer USB port or another hub circuit (neither of which are shown). Although the wall plate 10 is shown with a single USB connector 22, it will be appreciated by those skilled in the art that USB hub circuit 14, operating in conjunction with numerous USB connectors 22 formed in the forward-facing surface of wall plate 10, can be used to connect multiple USB devices. It will also be appreciated by those skilled in the art that a variant of the wall plate 10 without a USB hub circuit may also be employed for situations where the need for multiple connectors or ports is not present.

As mentioned above, the configuration such as that depicted in FIG. 1 is referred to as a self-powered wall plate in that receives electrical power from external power supply 18 that feeds a transformer 20 and local USB power supply 16. The entire assembly may be placed inside a junction box (not shown) that in turn may be mounted within an opening formed in a wall (not shown). The combination of the external power supply 18, transformer 20 and local USB power supply 16, while allowing USB range to be extended, occupies a significant amount of volume in the assembly, as separate lines to provide the external power are needed. Thus, while such a configuration can be used for multiple USB devices, the additional wiring associated with the power supply 18, coupled with the wiring needed for the numerous connectors or ports, causes significant increases in size or complexity.

Figure 2A:
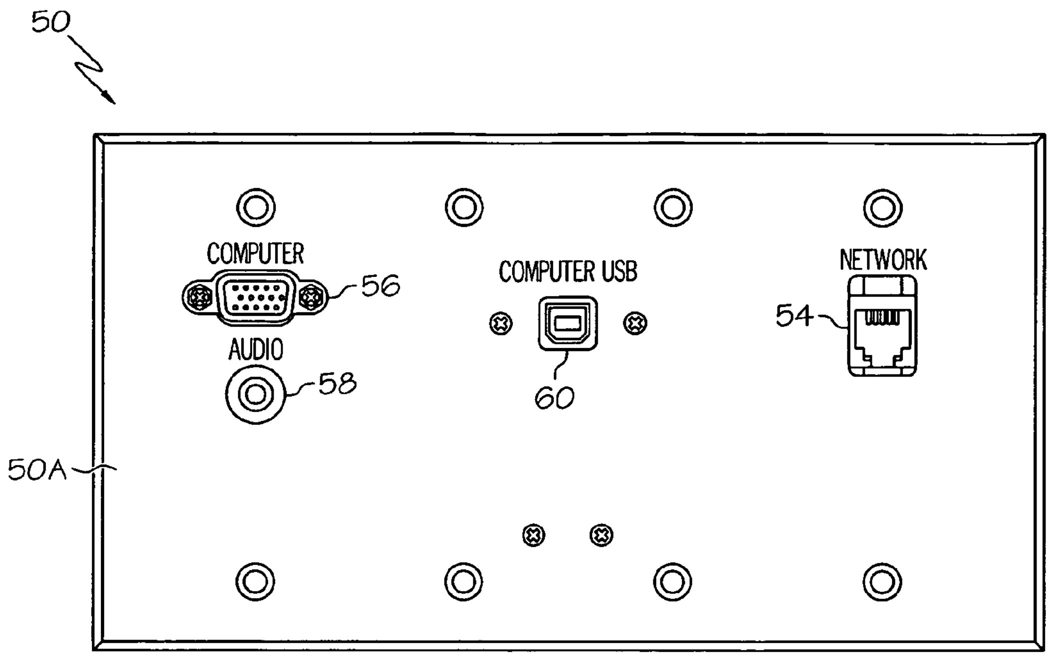
FIG. 2A (PRIOR ART)
FIG. 2A illustrates a forward view of a wall plate assembly with separately attached USB electronics according to another form of the prior art.
Figure 2B:
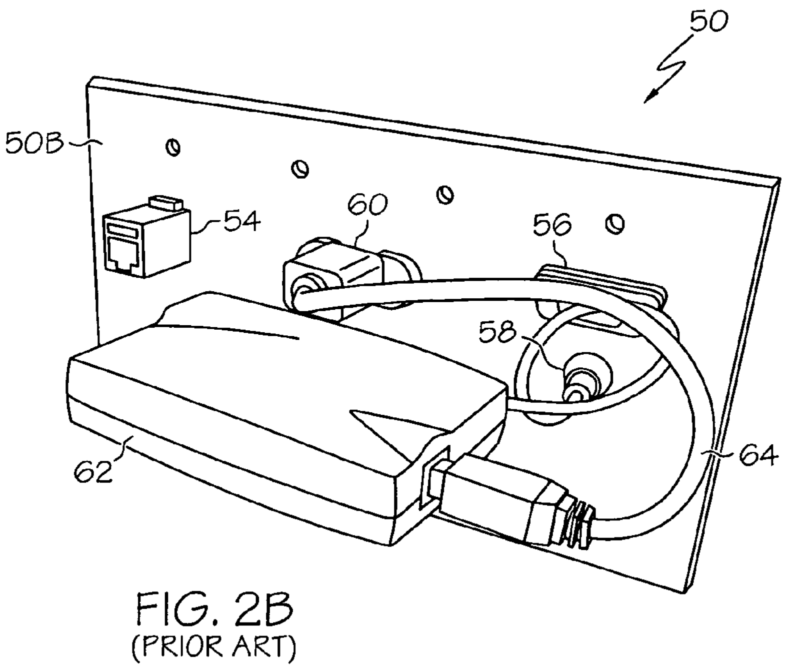
FIG. 2B (PRIOR ART)
FIG. 2B illustrates a rearward view of the wall plate assembly of FIG. 2A, highlighting the separate USB extender.

Referring next to FIGS. 2A and 2B, the assembly of a wall plate 50 according to the bus-powered form of the prior art is shown. As with the self-powered version discussed above, wall plate 50 allows a USB to be extended over greater operating lengths, as without the signal boosting made possible by the externally-powered USB connection of FIG. 1, or the bus-powered version shown in FIGS. 2A and 2B, the length of wiring used to establish the connection is limited, typically to around five meters in length. A USB extender 62, such as that shown in with particularity in FIG. 2B and discussed in more detail below, can increase the length between a USB host and device by up to one hundred and fifty feet or more, as can the device of FIG. 1. Referring with particularity to FIG. 2A, a first (forward-facing) surface 50A is shown with various connectors mounted therein, including a network connector 54, computer connector 56, audio connector 58 and USB connector 60 of the Type B variety. Power for the USB is delivered through USB connector 60 from a host, such as a computer (not shown).

Referring with particularity to FIG. 2B, a second (rearward-facing) surface 50B is shown with the rearward portions of the network, computer, audio and USB connectors 54, 56, 58 and 60 projecting therethrough. The USB extender 62 is in the form of a self-contained modular unit that is attached to the rearward-facing surface 50B, and acts as a receiver to accept appropriate USB signals from a complementary transmitter (not shown). Such an extender may function in a manner generally similar to that of the device of FIG. 1, with the exception of how it derives its operating power, where instead of taking power from an external source, it takes it from the upstream USB host. In addition to containing extender circuitry, the USB extender 62 may also include DC power conditioning circuitry in order to ensure proper voltage is delivered to the remote device.

A separate dongle cable 64 is used to establish electrical connectivity between the USB connector 60 and the USB extender 62. The dongle cable 64 terminates on at least one end with a quick-connect coupling. USB extender 62 is not integrated into wall plate 50, as it is secured (if at all) to the rear surface of wall plate 50 through a limited contact, which may be glued, fastened (such as by screws that extend through the wall plate 50 and into complementary threads formed in the USB connector 62), snap-fit or otherwise mechanically joined together. By these features, the wall plate 50 is not truly integrated, in that while it possesses the equipment necessary to establish signal connectivity between a host and device, the modular, removable nature of the connection between the wall plate 50 and the USB extender 62 belies a lack of permanence that is associated with integration. Furthermore, the dongle cable 64 is packaged in such a way as to leave exposed many of the delicate connecting features. For example, dongle cable 64 is left exposed, such that upon installation or transport, its signal connection between the USB connector 60 and USB extender 62 is susceptible to damage or becoming disconnected. Further, the length of the dongle cable 64 (which my be up to six inches or more) is such that it can extend beyond the footprint of the wall plate 50, thereby making the installer's job more difficult. It is worth noting that merely covering the exposed components, such as dongle cable 64 and USB extender 62, with a junction box or related cover is not sufficient in and of itself to establish the requisite degree of integration, as their degree of connectivity to at least each other, as well as to wall plate 50, would remain unchanged.

Figure 3A:
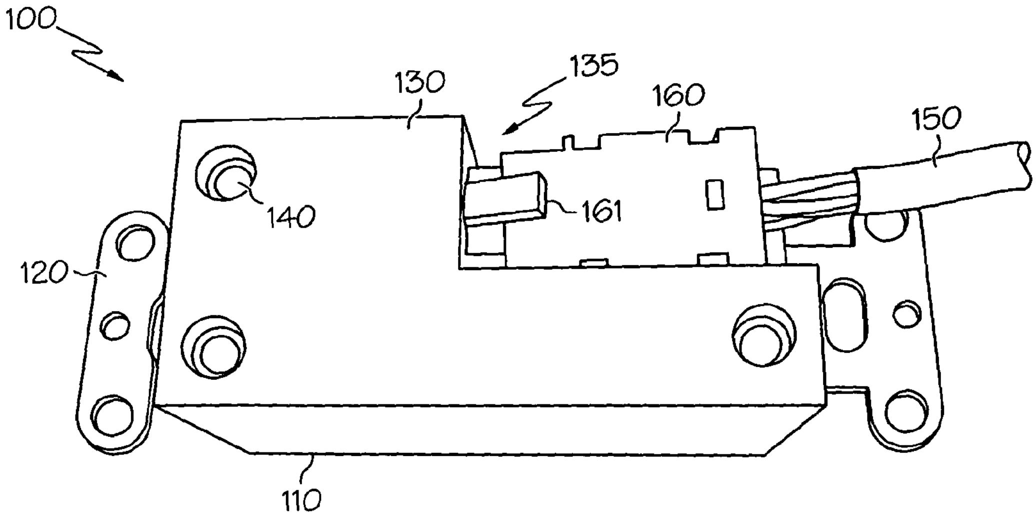
FIG. 3A illustrates a generally rearward view of a wall plate assembly according to an embodiment of the present invention, shown coupled to a USB wire.
Figure 3B:
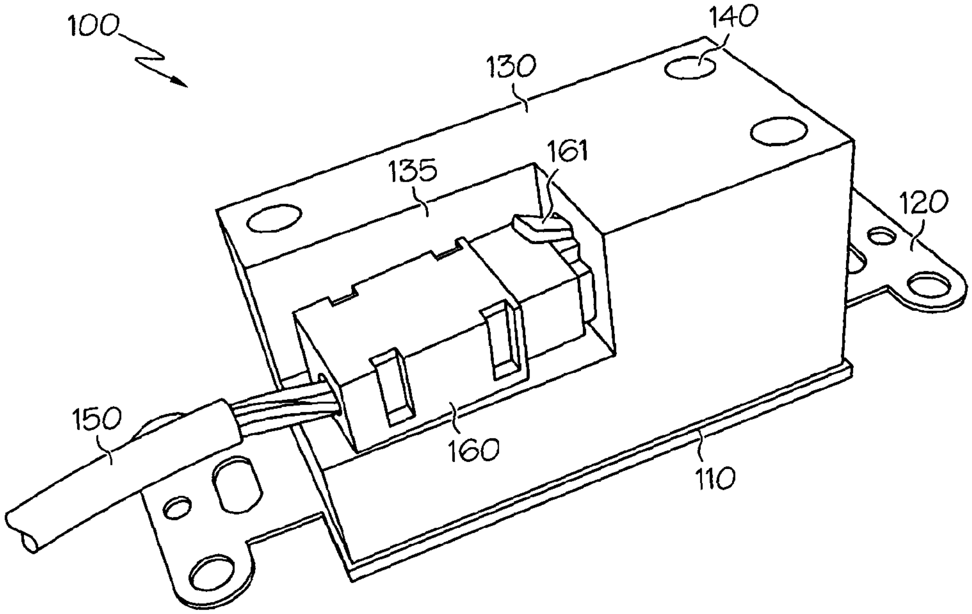
FIG. 3B illustrates a rearward perspective view of the wall plate assembly of FIG. 3A.
Figure 4A:
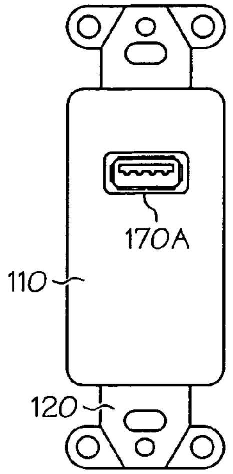
FIG. 4A illustrates a front view of a wall plate according to an aspect of the present invention with a Type A USB connector.
Figure 4B:
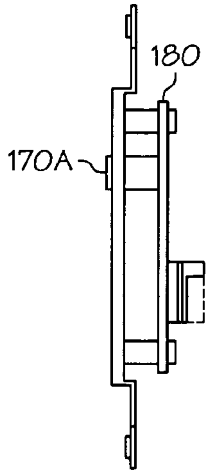
FIG. 4B illustrates a side view of the wall plate of FIG. 4A.
Figure 4C:
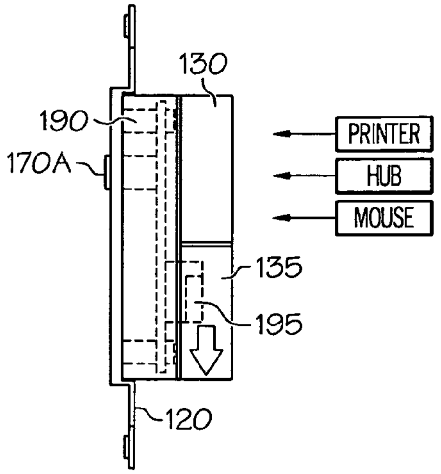
FIG. 4C illustrates the side view of the wall plate of FIG. 4A with a housing covering the back thereof.
Figure 4D:
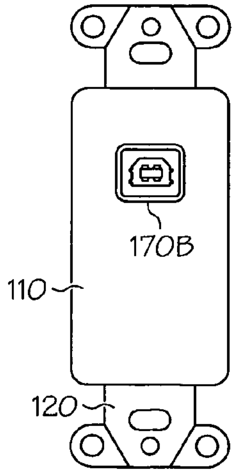
FIG. 4D illustrates a front view of a wall plate according to an aspect of the present invention with a Type B USB connector.
Figure 4E:
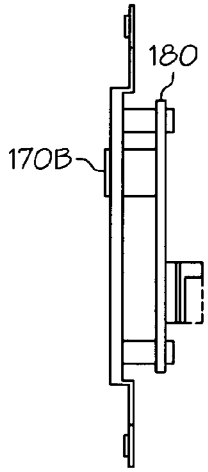
FIG. 4E illustrates a side view of the wall plate of FIG. 4D.
Figure 4F:
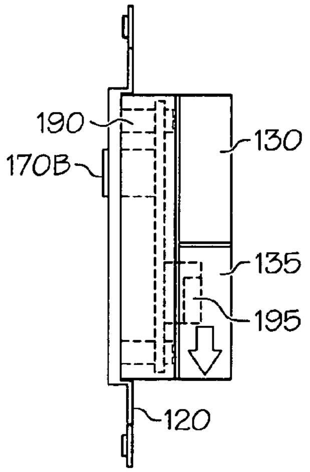
FIG. 4F illustrates a side view of the wall plate of FIG. 4D with a housing covering the back thereof.

Referring next to FIGS. 3A and 3B, the back (or rear) side of a wall plate assembly 100 according to an aspect of the present invention is shown. In it, a wall plate 110 is shown supported by the mounting bracket (also referred to as a wall mounting member) 120. The bracket 120 includes apertures that allow a screw or related fastener to pass therethrough for engagement with a stud, wall board or other structural member in the wall. A housing 130 with partial recess 135 is used to contain components of assembly 100 inside. Wiring 150 (shown presently as twisted pair) supplies signals from a host or other device (neither of which are shown) to the assembly 100, connected through a jack 160 that is shaped to mechanically cooperate (such as by snap-fit or other resilient connection) to an electrical interface 195 (also known as an outlet, described below) formed on a printed circuit board 180 such that it can cooperate with wiring 150 and jack 160 through a cutout formed in recess 135. The nature of the recess 135 is such that when external wiring 150 and ancillary connectors (such as jack 160) engage the housing 130, they do so without increasing the footprint of wall plate assembly 100. By having housing 130 contain all of the electrical USB and related signal connectors, ports and associated wiring, the robustness of assembly 100 is enhanced, as the likelihood of damage during installation is reduced by the presence of a rigid structure with electrical connections achieved through relativelyunexposed flush mounting. Unlike the non-integrated configurations of the prior art, circuit board 180 preferably includes the USB extender circuitry directly thereon, thereby minimizing the chance of disparate components and their connections from coming apart during shipping, storing or installation.

Referring next to FIGS. 4A through 4F, front and side views of the wall plate assembly of FIGS. 3A and 3B are shown, where one of each of the side views shows the wall plate 110 with the housing 130 attached, and the other without, the latter thereby exposing the printed circuit board 180 and a coupling in the form of electrical interface 195 that is compatible with jack 160 such that the two form a snap-fit or related connection. Printed circuit board 180 is mounted to either the bracket 120 or to the rear surface of the wall plate 110 (this latter configuration as shown in the side views) through posts 190. Soldering, adhesives, friction fit or related connection can be used to promote an integral relationship between the printed circuit board 180 and wall plate 110 or bracket 120. Housing 130 is mounted to either or both of the bracket 120 and wall plate 110 through a series of fasteners 140 (which may be in the form of screws, rivets, adhesives or the like), while the electrical interface 195 and USB extender electronics are mounted to or formed in printed circuit board 180 in such a way as to form an integrated whole with one or more of the bracket 120, wall plate 110 and housing 130.

As can be seen in the side views, the USB connectors (collectively 170, but shown as a Type A connector 170A in FIGS. 4A through 4C and a Type B connector 170B in FIGS. 4D through 4F) extend through the wall plate 110 to allow user access to the front side of the wall plate 110. Although Type A and Type B connectors are shown, it will be appreciated by those skilled in the art that other USB-compatible connectors may be used, such as micro USB connectors and mini USB connectors. Either of the connectors 170A, 170B are also electrically connected to the electrical interface 195 through the printed circuit board 180 such that signals generated by a USB host are passed to a USB device through the connectors 170A, 170B, printed circuit board 180 and electrical interface 195, the last of which includes a proximal end and a distal end, where the proximal end is in electrical communication with the printed circuit board 180, while distal end electrically connects to the jack 160, such as shown in FIGS. 3A and 3B. The printed circuit board 180 may contain (or have mounted thereon) the USB electronics and related circuitry, such as DC conditioning circuits or the like. The quick-connect nature of the electrical interface 195, such as by a resiliently biased spring or related snap-fit connection 161, provides a secure and fast coupling with the mating quick-connect electrical connector of the jack 160.

One valuable attribute of the wall plate 110 of the present invention is its modularity made possible by its integral, self-contained construction. The housing 130 may be formed from a plastic case (for example, a gang box, also referred to as a junction box) that also houses the terminus point (for example, the distal end of the electrical interface 195) of USB wiring 150. Other materials (for example, metal) may be used to provide additional capabilities as needed. For example, in situations requiring an enhanced level of electromagnetic shielding, a metal housing 130 may be used. Although shown for a single USB connector 170, it will be appreciated by those skilled in the art that additional electrical interfaces (not shown) and associated cutouts (also not shown) may be employed in the integrated approach discussed herein.

Printed circuit board 180 is of a generally planar construction and is fabricated by techniques well-known to those skilled in the art. The electronics that make up the USB extender may be mounted to or formed on the circuit board 180, thereby removing the need for a separate modular container, such as that shown in FIG. 2B. In one form, the circuit board 180 is substantially coextensive with the wall plate 110 or bracket 120 to better enable the incoming wiring 150 and accompanying jack 160 to line up with the appropriate wiring or circuitry on the circuit board 180. The circuit board 180 can be encased in the aforementioned housing 130, and by virtue of its direct connection between the USB connector 170 and the electrical interface 195, reduces the likelihood of wiring disconnects under normal shipping and installation. For example, the need for a separate dongle or related cable is removed, thereby avoiding the difficulty of keeping such components connected to one another during installation and use. By having the USB electronics formed on the printed circuit board 180, which is in turn integral with the bracket 120, wall plate 110 and housing 130 within the wall plate assembly 100, reliable, volumetrically efficient USB connectivity is promoted.

Figure 5:
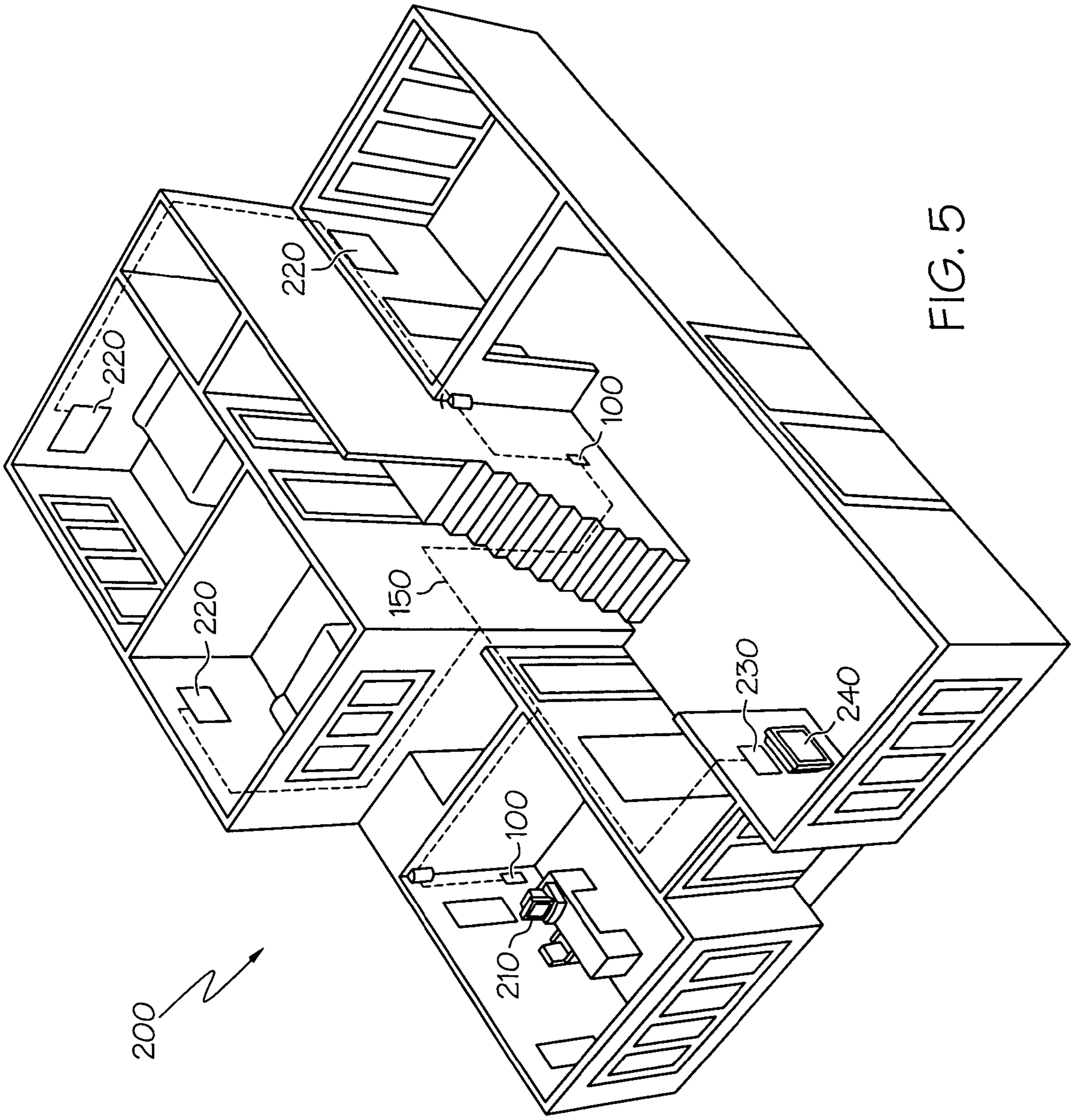
FIG. 5 shows a house using premise wiring and one embodiment of the wall plate assembly of the present invention.
Figure 6:
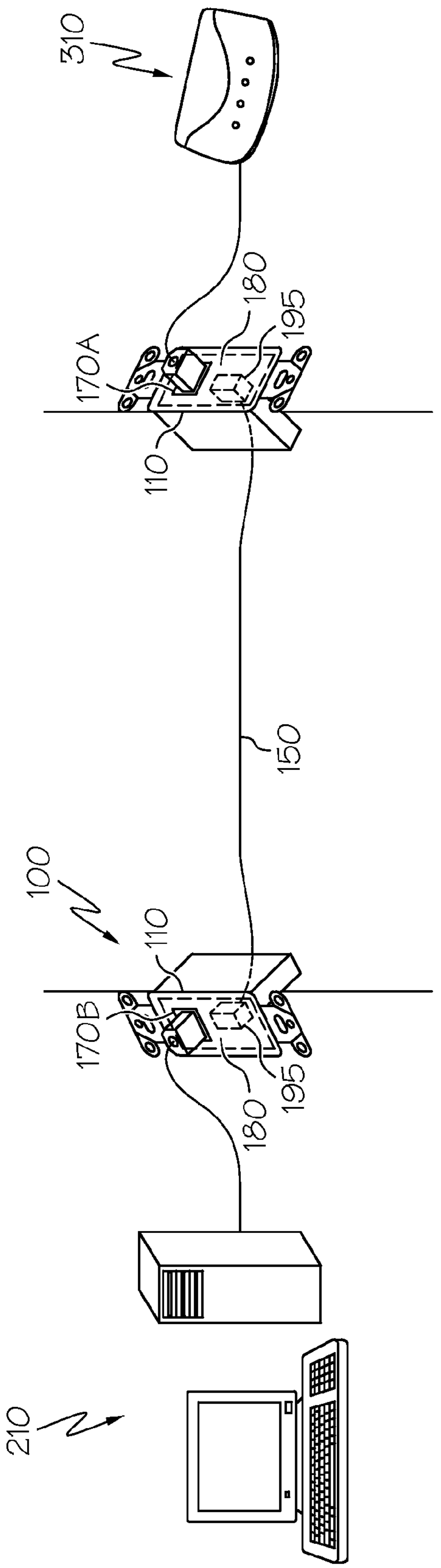
FIG. 6 shows a USB-compatible wiring system according to an embodiment of the present invention.

Referring next to FIGS. 5 and 6, the placement of integral wall plate assemblies 100 within a wiring system in a dwelling 200, as well as a notional bus-powered USB wiring system according to an embodiment of the present invention is shown. Referring with particularity to FIG. 5, while the term “dwelling” is shown as a home, dormitory, apartment or other residence where people live, it will be appreciated that it may also be used to describe an office, factory, classroom or other commercial, institutional or manufacturing facility where people learn, work or the like. The wiring system can be responsive to input from an electrical device, such as a central control panel 230 (which may be connected to a multimedia system 240 or the like) or computer 210, the latter acting as a transmitter of USB signals. As shown, wall plate assemblies 100 can form either a terminus point or an intermediary point within wiring system. One form of device that can benefit from a USB connection according to the present invention is a monitor 220. Monitors 220 can be placed in various locations within dwelling 200 to facilitate the transmission of various signals (for example, audio/visual signals). In another form (not shown), computer peripheral equipment, such as printers, monitors or the like, can be placed remotely relative to the computer 210. Referring with particularity to FIG. 6, wall plate assemblies 100 are connected between a transmitter shown in the form of the USB-compatible computer 210, and a receiver shown in the form of a USB hub 310, although it will be appreciated that the receiver can be any number of USB-compatible devices, such as hard drive enclosure, printer, projector, white boards or the like. USB-compatible wiring 150 (for example, the aforementioned RJ45 CAT 5 cable) is used to interconnect the various devices. In the form shown, one of the wall plate assemblies 100 includes a USB Type B connector 170B signally adjacent the source provided by computer 210, while another of the wall plate assemblies 100 includes a USB Type A connector 170A signally adjacent the (receiver) device 310.

Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. A wall plate assembly comprising:

a wall plate defining a face thereon and comprising at least one universal serial bus connector formed in said face;

a wall mounting member;

a circuit board comprising universal serial bus booster circuitry;

an electrical interface extending from said circuit board and cooperative with said universal serial bus booster circuitry such that upon coupling of said interface to a first universal serial bus-compatible component, a signal passes through said universal serial bus booster circuitry while being transmitted between the first universal serial bus-compatible component and a second universal serial bus-compatible component that is coupled to said connector; and a housing configured to substantially contain said circuit board and mount to at least one of said mounting member, wall plate and circuit board such that said universal serial bus booster circuitry on said circuit board is integrally formed with said assembly.

2. The assembly of claim 1, wherein said wall mounting member comprises a bracket configured to accept a fastener therethrough.

3. The assembly of claim 1, wherein said universal serial bus booster circuitry is formed on said circuit board.

4. The assembly of claim 1, wherein said universal serial bus booster circuitry is mounted to said circuit board.

5. The assembly of claim 1, wherein said wall mounting member and said wall plate are formed as a unitary structure.

6. The assembly of claim 1, further comprising at least one post extending between said circuit board and said wall plate to create a spaced relationship therebetween.

7. The assembly of claim 1, wherein said wall plate, wall mounting member, circuit board and housing are rigidly affixed to one another.

8. The assembly of claim 1, wherein said housing defines a recess in an otherwise substantially rectangular shaped outer dimension, said recess defining a cutout therein such that said coupling between said interface and the first universal serial bus-compatible component can be effected therethrough.

9. The assembly of claim 1, wherein said universal serial bus booster circuitry is permanently affixed to said circuit board.

10. The assembly of claim 1, further comprising at least one of a transmitter and a receiver signally coupled to said universal serial bus booster circuitry.

11. A bus-powered universal serial bus wiring system comprising:

at least one wire configured to convey a universal serial bus-compatible signal, said wire comprising a proximal end configured to connect to a universal serial bus host and a distal end configured to connect to a universal serial bus device; and a wall plate assembly comprising:

a wall plate defining a face thereon and comprising at least one universal serial bus connector formed in said face;

a wall mounting member;

a circuit board comprising universal serial bus extender circuitry;

an electrical interface extending from said circuit board and cooperative with said universal serial bus extender circuitry such that upon coupling of said interface to one of said proximal and distal ends of said wire, a signal that is transmitted between the host and device may be operated upon by said universal serial bus extender circuitry while passing through said wall plate assembly, said universal serial bus extender circuitry electrically coupled to one of said connector and said interface such that it receives its operating electrical power from a respective one of the universal serial bus host and device; and a housing configured to substantially contain said circuit board and mount to at least one of said mounting member, wall plate and circuit board such that said universal serial bus extender circuitry on said circuit board is integrally formed with said assembly.

12. The wiring system of claim 11, wherein said wall plate assembly comprises a plurality of wall plate assemblies signally coupled to one another by said at least one wire.

13. The wiring system of claim 12, wherein a first of said plurality of wall plate assemblies further comprises a transmitter and a second of said plurality of wall plate assemblies further comprises a receiver.

14. The wiring system of claim 13, wherein said transmitter is placed serially upstream of said receiver.

15. A method of connecting universal serial bus-compatible electronic components through a wall plate assembly, said method comprising:

configuring a first component to be a universal serial bus host through a transmitter;

configuring a second component to be a universal serial bus device through a receiver; and signally coupling said first and second devices through an electrically conductive wire and said wall plate assembly, said wall plate assembly comprising:

a wall plate defining a face thereon and comprising at least one universal serial bus connector formed in said face;

a wall mounting member;

a circuit board comprising universal serial bus extender circuitry;

an electrical interface extending from said circuit board and cooperative with said universal serial bus extender circuitry such that upon coupling of said interface to at least one of said first and second components and passing a signal therebetween, the signal passes from said transmitter to said receiver through said universal serial bus extender circuitry, said universal serial bus extender circuitry connected to at least one of said wall mounting member and said wall plate such that together they comprise an integrated whole.

16. The method of claim 15, further comprising securing at least one of said wall plate, wall mounting member and circuit board to a housing configured to substantially contain said circuit board.

17. The method of claim 15, further comprising providing electric power to said wall plate assembly from said host.

18. The method of claim 15, wherein said first component comprises a computer.

19. The method of claim 18, wherein said second component is selected from the group consisting of a printer, video display, cellular telephone, digital camera, scanner, bar code reader, modem, personal digital assistant and an integrated services digital network terminal adapter.

* * * * *